United States Patent [19]

Kitaoka

[11] Patent Number: 4,829,240
[45] Date of Patent: May 9, 1989

[54] SECONDARY ELECTRON MEASURING CIRCUIT

[75] Inventor: Shuji Kitaoka, Yokohama, Japan

[73] Assignee: Kabushiki Kaisha Toshiba, Kawasaki, Japan

[21] Appl. No.: 116,151

[22] Filed: Nov. 3, 1987

[30] Foreign Application Priority Data

Nov. 7, 1986 [JP] Japan ................................ 61-265033

[51] Int. Cl.$^4$ ..................... G01R 31/28; G01N 23/225
[52] U.S. Cl. .................................. 324/158 R; 250/311; 324/73 R
[58] Field of Search ............ 324/158 R, 73 PC, 73 R, 324/71.3; 250/310, 311

[56] References Cited

U.S. PATENT DOCUMENTS

| | | | |
|---|---|---|---|
| 4,413,181 | 11/1983 | Feuerbaum ..................... | 324/158 R |
| 4,675,602 | 6/1987 | Feuerbaum et al. ............. | 324/158 R |
| 4,692,690 | 9/1987 | Hara et al. ........................ | 324/158 R |
| 4,704,576 | 11/1987 | Tributsch et al. ............... | 324/158 R |

Primary Examiner—Ernest F. Karlsen
Attorney, Agent, or Firm—Finnegan, Henderson, Farabow, Garrett, & Dunner

[57] ABSTRACT

A secondary electron measuring circuit includes a secondary electron detector for detecting secondary electron pulses sequentially emitted from the measurement point in a semiconductor circuit chip, a peak holding circuit for holding the peak level of each output pulse from the secondary electron detector and an analog/digital converter for converting an output signal of the peak hold circuit into a digital signal. It further includes a correction coefficient generator for generating as output data a correction coefficient indicating the degree of the local field effect which is determined based on the potential distribution in an area including the measurement point and a digital multiplier for deriving the product of output data of the analog/digital converter and output data of the correction coefficient generator.

6 Claims, 2 Drawing Sheets

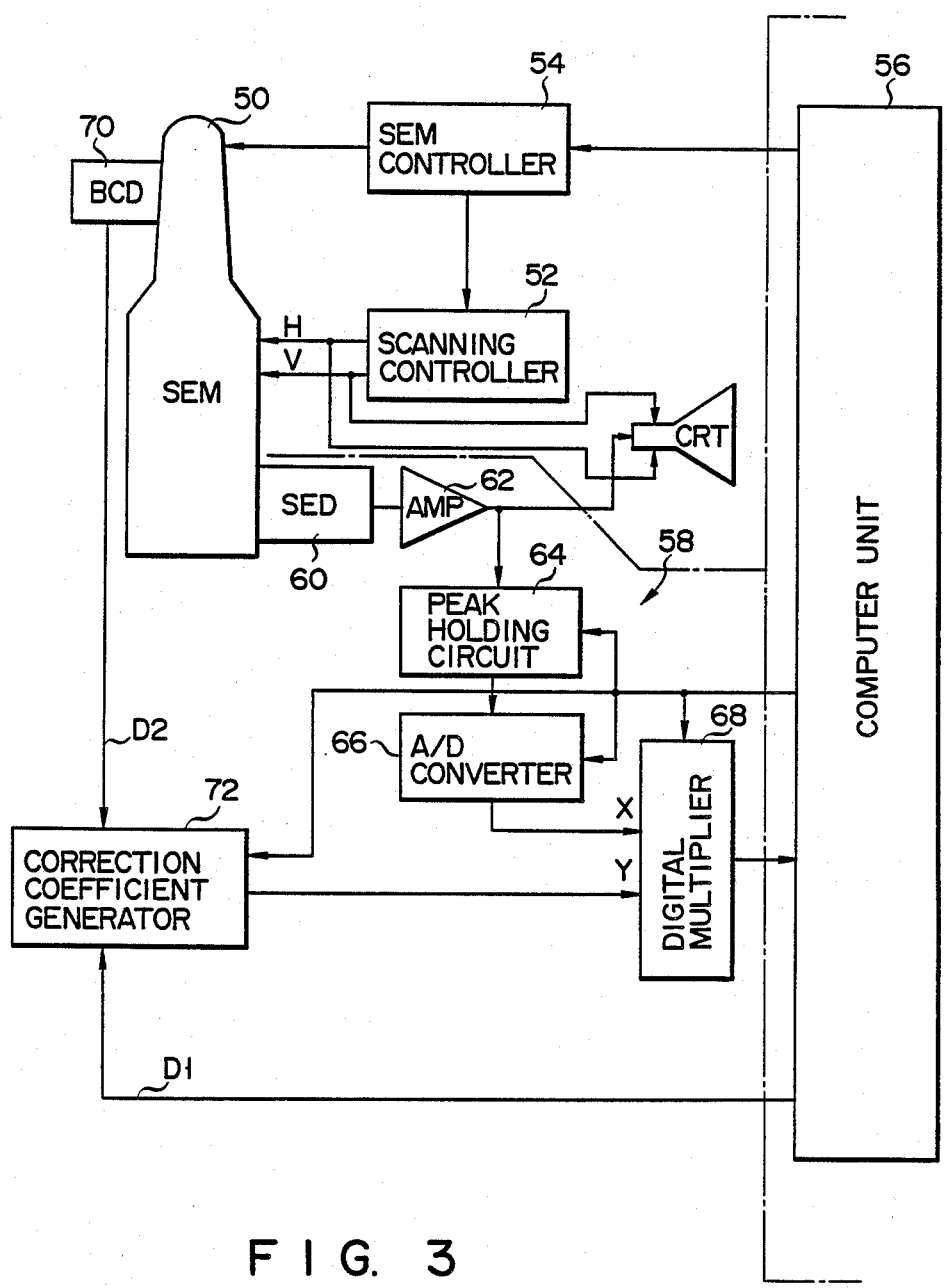
F I G. 3

SECONDARY ELECTRON MEASURING CIRCUIT

BACKGROUND OF THIS INVENTION

This invention relates to a test system for semiconductor circuit chips and more particularly to a secondary electron measuring circuit for measuring secondary electrons emitted from part of a semiconductor circuit chip to which an electron beam is applied or irradiated.

For analysis of the operation of a semiconductor integrated circuit chip, electron beams are applied or irradiated to some node portions in the semiconductor integrated circuit chip, and the amount of secondary electrons emitted from the node portions are detected or measured. The application or irradiation of the electron beam is effected by, for example, using a scanning type electron microscope (SEM). During the analysis of the operation, the integrated circuit is controlled in accordance with test data, for example, so as to periodically change the potential at a desired node portion or measurement point in a predetermined variation mode. The electron beam is intermittently generated in synchronism with the operation of changing the potential in the same manner as a strobe light, and is applied to each measurement point as beam pulses. Each pulse is generated in a preset phase relationship with respect to the period of potential variation at the measurement point, and is therefore applied to the measurement point each time the potential at the measurement point is set at a preset level. The amount of secondary electrons is measured each time the beam pulse is applied to the measurement point and measurements thus obtained are averaged to enhance the S/N ratio. The average of the detected amount of secondary electrons can be obtained by adding all the measurements and dividing the total sum by the number of measurements. The potential at the node has a correlated relation with respect to the amount of secondary electrons and can be derived from the average of the detected amount of secondary electrons.

In the operation analysis, it is checked to see if the potential at the measurement point changes in accordance with a designed variation mode. For this purpose, the application of electron beams is delayed by a predetermined phase amount with respect to the period of variation in potential at the measurement point each time the amount of secondary electrons are measured by a number of times required for the averaging process. The potential variation at the measurement point can be detected as a variation in the average of the amount of secondary electrons detected n each phase. Therefore, if it is detected that the potential variations at all the measurement points respectively conform to the designed variation, the integrated circuit can be determined to be properly performing its designed functions, and if it is not, the integrated circuit will be determined to be defective.

FIG. 1 shows the prior art secondary electron measuring circuit. When beam pulses are applied to the integrated circuit chip as described above, secondary electrons are emitted as periodic pulses from the circuit chip. The emitted secondary electron pulses are detected by means of secondary electron detector 10 including a photo multiplier or the like. The output pulses of secondary electron detector 10 are amplified by amplifier 12, smoothed by CR integrating circuit 14 and then converted into a digital signal corresponding to the measurement of the amount of secondary electrons by means of analog/digital (A/D) converter 16. The measurement signals are supplied to and averaged by a computer (not shown), for example. The secondary electron measuring circuit has the following disadvantages. That is, when the integrated circuit is formed at a high integration density to form an LSI, complicated test data must be supplied to the LSI circuit to initialize the potential of the measurement point. This lengthens the period of potential variation at the measurement point. In this case, it is necessary to increase the interval between successive applications of beam pulses or successive measurements of the amount of secondary electrons in accordance with the period of potential variation at the measurement point. In this case, since charges stored in a capacitor of CR integration circuit 14 are discharged over a period of time due to a leakage current, an output voltage of CR integration circuit 14 will be greatly lowered when the interval between measurements for the amount of secondary electrons is set relatively long. This deteriorates the S/N ratio of the measurements even if the measurements of the amount of secondary electrons are averaged. Such a problem cannot be neglected when it is taken into consideration that the current trend has been to increasingly integrate integrated circuits.

Now, a secondary electron measuring circuit disclosed in Japanese Patent Application (Application No. 56-21498) filed by the same applicant is explained with reference to FIG. 2. When secondary electrons are periodically emitted in the form of pulses from the integrated circuit chip, each of the secondary electron pulses is detected by secondary electron detector 20 which in turn produces corresponding output pulses. The output pulses of secondary electron detector 20 are supplied to peak holding circuit 22 and each of the peak levels thereof is temporarily held in peak hold circuit 22 and then converted into a digital signal and generated as a measurement of the amount of secondary electrons by A/D converter 24. The measurement is supplied to a computer (not shown) for the averaging process in such a manner as described above. The computer is also used to control the application of beam pulses. In the secondary electron measuring circuit, peak holding circuit 22 holds the peak level of an input pulse for a period corresponding to the interval between successive applications of beam pulses. Owing to this, the amount of secondary electrons can be correctly measured or converted into a digital signal even when the interval between successive applications of beam pulses is set long.

However, if each emission of the secondary electrons is constantly influenced, the potential variation at the measurement point cannot be correctly detected even if the number of measurements of the amount of secondary electrons is increased. Each emission of the secondary electrons may be interfered in the same manner by an electric field created in an area including the measurement point. Such an electric field may inadvertently change the direction of the emission of secondary electrons. This is known as a local field effect. The local field effect makes it difficult to measure the amount of secondary electrons at various measurement points under the same conditions.

SUMMARY OF THE INVENTION

An object of this invention is to provide a secondary electron measuring circuit which can correctly measure the amount of secondary electrons emitted from a measuring point in a semiconductor circuit chip by applying an electron beam to the measuring point.

This object can be achieved by providing a secondary electron measuring circuit which comprises a secondary electron detector for detecting secondary electron pulses emitted from a measuring point in a semiconductor circuit chip, a peak holding circuit for holding the peak level of each output pulse from the secondary electron detector, an A/D converter for converting an output signal of the peak holding circuit into a digital signal, correction coefficient generating circuit for generating a correction coefficient indicating the degree of the local field effect in accordance with the distribution of potential in an area including the measuring point, and a multiplier circuit for multiplying output data of the A/D converter by the correction coefficient from the correction coefficient generating circuit.

In the secondary electron measuring circuit of this invention, output data of the A/D converter is multiplied by the correction coefficient by means of the multiplier circuit. Owing to this, noise components caused by the local field effect can be removed from the signal representing the amount of secondary electrons detected in the secondary electron detector, thereby making it possible to correctly measure the amount of secondary electrons. Therefore, in the case where a single computer is used to control the application of a primary electron beam and average the measured amount of secondary electrons in order to analyze the operation of the semiconductor circuit chip, the load imposed on the computer can be reduced. That is, with the secondary electron measuring circuit, the measurements of the amount of secondary electrons can be easily averaged with a high reliability by means of the computer without making the operation thereof complicated, and the processing time of the computer can be shortened.

BRIEF DESCRIPTION OF THE DRAWINGS

FIG. 3 is a circuit diagram of a test system for an LSI circuit chip including a secondary electron measuring circuit according to one embodiment of the this invention.

DETAILED DESCRIPTION OF THE PREFERRED EMBODIMENTS

Figure 1:
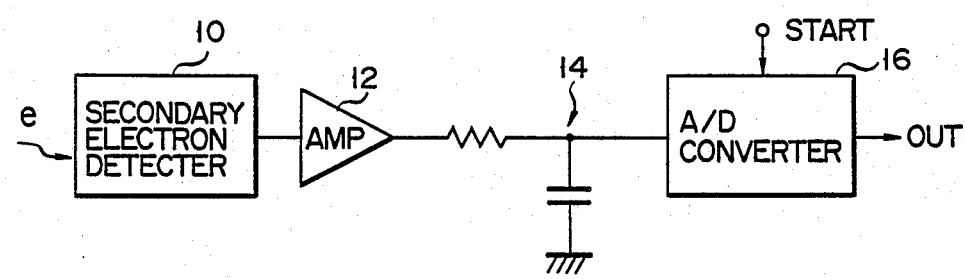
FIG. 1 is a circuit diagram of the prior art secondary electron measuring circuit.
Figure 2:
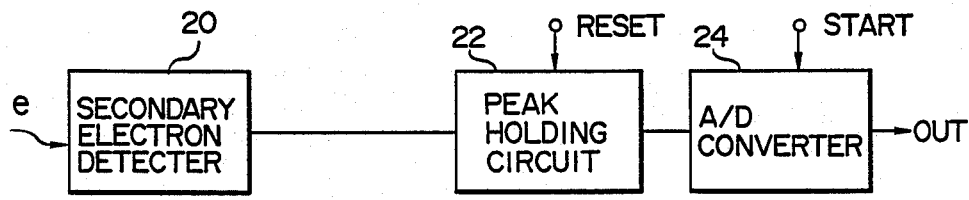
FIG. 2 is a circuit diagram of a different prior art secondary electron measuring circuit.

There will now be described an embodiment of this invention with reference to FIG. 3 which shows a test system for an LSI circuit. The test system includes stroboscopic SEM 50, scanning controller 52, SEM controller 54 and computer unit 56. The LSI circuit chip to be tested is contained in SEM 50 and arranged so that an electron beam can be applied to any desired measurement point on the LSI circuit chip. Stroboscopic SEM 50 and scanning controller 52 are driven by SEM controller 54 under a condition of computer unit 56. An electron beam is generated by stroboscopic SEM 50 in the form of periodic pulses, as explained in the prior att secondary electron measuring circuit, and is directed by scanning controller 52 to a selected one of the measurement points. When the electron beam pulses are sequentially applied or irradiated to the selected measurement point, secondary electron pulses are emitted from the measurement point in response to the electron beam pulses.

The test system includes secondary electron measuring circuit 58 to measure the amount of secondary electrons emitted from the measurement point. Secondary electron measuring circuit 58 includes secondary electron detector 60, amplifier 62, peak holding circuit 64 and A/D converter 66, which are serially connected in the order described. Secondary electron detector 60 is attached to SEM 50 and comprises a photo multiplier, for example. Secondary electron pulses are sequentially detected by secondary electron detector 60 and then amplified by amplifier 62 which in turn supplies output pulses to peak holding circuit 64. Peak holding circuit 64 has a reset control terminal to receive clock pulses in synchronism with the application of beam pulses to the LSI circuit chip. The clock pulses are generated by computer unit 56. Peak holding circuit 64 is reset in response to a leading edge of each clock pulse, senses the peak level of an output pulse of amplifier 62 in a period corresponding to the duration of the beam pulse, and holds the peak level thereafter. That is, the peak level of each secondary electron pulse is held in an interval between successive applications of corresponding beam pulses. An output signal from peak holding circuit 64 is supplied to A/D converter 66 which has a start control terminal to receive clock pulses from computer unit 56. In response to a trailing edge of each clock pulse, A/D converter 66 starts to effect an A/D converting operation in order to convert an output signal of peak holding circuit 64 into a digital signal. Thus, the peak level of each secondary electron pulse is converted into a digital signal in the corresponding interval and supplied to the next stage.

Further, secondary electron measuring circuit 58 includes digital multiplier 68 with an adding function, beam current detector 70 and correction coefficient generator 72. Digital multiplier 68 has X- and Y-input ports connected to respectively receive output data from A/D converter 66 and correction coefficient generator 72. Digital multiplier 68 derives the product of two items of input data in synchronism with the clock pulses and supplies the derived product to computer unit 56. In the case where a preset number of adding operations are assigned to multiplier 68, the results of multiplication are accumulatively added together and the result of addition is supplied to computer unit 56 after clock pulses of the same number as the preset number are counted.

Beam current detector 70 is mounted on stroboscopic SEM 50, and is formed to have as a reference level a preset current value equal to the current value of the beam pulses used in SEM 50. Beam current detector 70 is designed to detect the current level of the beam pulse applied to the measurement point, compare the detected current level with the reference level and produce output data D2 corresponding to a difference between the compared current levels. Correction coefficient generator 72 has set therein correction coefficient D1 indicating the degree of the local field effect and is connected to receive output data D2 from beam current detector 70. Correction coefficient D1 is determined based on the potential distribution in an area including the measurement point by means of, for example, computer unit 56 and is set in correction coefficient generator 72 prior to the measurement of the amount of secondary electrons. In general, since the wiring pattern of the LSI circuit chip is designed by use of a CAD system, the potential distribution at and around the measurement point can be easily derived from the layout of the designed wiring pattern. In correction coefficient generator 72, correction coefficient Dl is corrected according to output data D2 from beam current detector 70 and then supplied to digital multiplier 68 in synchronism with the clock pulses. When a primary beam current larger than the preset current level is detected in beam current detector 70, correction coefficient Dl is reduced by an amount corresponding to the difference between the primary beam current and the preset current, the corrected correction coefficient is generated as output data of correction coefficient generator 72. In contrast, when the primary beam current smaller than the preset current is detected in beam current detector 70, correction coefficient Dl is increased by an amount corresponding to the difference between the primary beam current and the preset current and is generated as output data of correction coefficient generator 72. In this case, correction coefficient Dl is newly set each time the measurement points are changed.

Thus, output data from A/D converter 66 is corrected according to output data of correction coefficient generator 72 by means of digital multiplier 68 in order to remove noise components due to the local field effect and variation in the beam pulses from the secondary electron pulse generated at the measurement point. Then, the output data is supplied to computer unit 56. Output data of digital multiplier 68 is subjected to an averaging process in computer unit 56 to provide the operation analysis of the LSI circuit. In the case where the adding process is not assigned to digital multiplier 68, a preset number of output data successively generated from digital multiplier 68 are accumulatively added together and the result of addition is divided by the number of the output data added in computer unit 56. In contrast, when the addition process is assigned to digital multiplier 68, output data of digital multiplier 68 is divided by the number of adding operations effected in digital multiplier 68.

With the test system for the LSI circuit chip including the secondary electron measuring circuit of the construction as described above, it is possible to minimize fluctuation in the measurement condition caused by a variation in the beam current and the influence of the local field effect in an area including the measurement point. This prevents a voltage at each node from being erroneously measured during the operation of the LSI, and at the same time, shortens the time for the computer unit to effect the averaging process.

In the embodiment described above, the correction coefficient representing the degree of the local field effect is corrected according to variation in the amount of the irradiated beam. However, it is also possible to omit the coefficient correcting operation and supply the correction coefficient from the correction coefficient generator to the digital multiplier in order to obtain highly precise measurements. Further, the clock pulses and correction coefficient Dl can be generated or determined by means of another circuit.

What is claimed is:

1. A secondary electron measuring circuit for measuring secondary electron pulses sequentially emitted from a measurement point in a semiconductor circuit chip to which an electron beam is applied or irradiated, comprising:
   secondary electron detecting means for detecting said secondary electron pulses sequentially emitted from said measurement point in said semiconductor circuit chip and for generating an output pulse corresponding to each of said electron pulses detected;
   peak holding means for holding the peak level of each of said output pulses from said secondary electron detecting means and for generating an output signal corresponding to each of said output pulses from said secondary electron detecting means;
   analog/digital converting means for converting each of said output signals from said peak holding means into a digital signal;
   correction coefficient generating means for generating a correction coefficient signal indicating the degree of the local field effect corresponding to the potential distribution in an area including said measurement point; and
   multiplier means for generating an output signal corresponding to the product of the digital signal from said analog/digital converting means and the correction coefficient signal from said correction coefficient generating means.

2. A secondary electron measuring circuit according to claim 1, wherein said correction coefficient generating means includes a beam current detector for detecting an amount of variation in a primary beam current applied to said measurement point and for generating a signal corresponding to said primary beam current variation, and a correction coefficient generator having set therein a correction coefficient indicating the degree of the local field effect determined according to the potential distribution in the area including said measurement point, said correction coefficient being corrected according to said current variation signal generated from said beam current detector.

3. A secondary electron measuring circuit according to claim 2, wherein said multiplier means is a digital multiplier with an adding function for sequentially deriving the products of the digital signals from said analog/digital converting means and the correction coefficient signals from said correction coefficient generating means and accumulatively adding the multiplication results by a present number of times.

4. A secondary electron measuring circuit according to claim 3, wherein said secondary electron detecting means includes a secondary electron detector for detecting secondary electron pulses sequentially emitted from the measurement point in the semiconductor circuit chip and an amplifier for amplifying output pulses from said secondary electron detector.

5. A secondary electron measuring circuit according to claim 4, wherein said secondary electron detector comprises a photo multiplier.

6. A secondary electron measuring circuit according to claim 5, wherein said semiconductor circuit chip is an LSI circuit chip.

* * * * *